US008310018B2

(12) United States Patent
Jamet et al.

(10) Patent No.: US 8,310,018 B2
(45) Date of Patent: Nov. 13, 2012

(54) FERROMAGNETIC SEMICONDUCTOR, METHOD FOR THE PRODUCTION THEREOF, COMPONENTS INCORPORATING THE SAME, AND CORRESPONDING USES OF SAID SEMICONDUCTOR (75) Inventors: Matthieu Jamet, Voiron (FR); Yves Samson, Grenoble (FR); André Barski, Moirans (FR); Thibaut Devillers, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 944 days.

(21) Appl. No.: 12/161,995

(22) PCT Filed: Feb. 1, 2007

(86) PCT No.: PCT/FR2007/000186
§ 371 (c)(1),
(2), (4) Date: Oct. 16, 2008

(87) PCT Pub. No.: WO2007/090946
PCT Pub. Date: Aug. 16, 2007

(65) Prior Publication Data
US 2009/0230954 A1    Sep. 17, 2009

(30) Foreign Application Priority Data

Feb. 9, 2006 (FR) ...................... 06 01149

(51) Int. Cl.
*H01L 29/82* (2006.01)
(52) U.S. Cl. ................. 257/421; 257/E43.003; 977/935
(58) Field of Classification Search ........... 257/E21.208, 257/E43.003; 977/933, 935
See application file for complete search history.

(56) References Cited

U.S. PATENT DOCUMENTS

| 3,850,706 A * | 11/1974 | Street ........................ 428/450 |
| 6,307,241 B1 | 10/2001 | Awschalom et al. |
| 2005/0006673 A1 | 1/2005 | Samuelson et al. |

OTHER PUBLICATIONS

Galanakis et al., "Stability of ferromagnetism in the half-metallic pnictides and similar compounds: a first-principles study", Journal of Physics: Condensed Matter, Jun. 10, 2005, pp. 3915-3930.*
Devillers et al., "Structural and magnetic properties of GeMn layers; High Curie temperature ferromagnetism induced by self organized GeMn nano-columns", phys. stat. sol., (a) 204, No. 1, Dec. 20, 2006, pp. 130-135.*

(Continued)

*Primary Examiner* — Daniel Whalen
(74) *Attorney, Agent, or Firm* — Alston & Bird LLP (57) ABSTRACT The inventive ferromagnetic semiconductor comprises at least one magnetic element selected from the group consisting of Mn, Fe, Co, Ni and Cr, and has a Curie temperature which is equal to or higher than 350 K, and advantageously 400 K or higher. The semiconductor has a matrix which is depleted in magnetic element(s) and contains a discontinuous phase which is formed from columns, enriched with magnetic elements, and is ferromagnetic up to said Curie temperature, in such a way as to generate a lateral modulation of the composition of the semiconductor in the plane of the thin layer. Also disclosed is a method for the production of the semiconductor, a diode-type electronic component for the injection or collection of spins into or from another semiconductor respectively, or an electronic component which is sensitive to a magnetic field, and uses of the semiconductor relating to such a component.

19 Claims, 3 Drawing Sheets

OTHER PUBLICATIONS

International Search Report for PCT/FR2007/000186 filed Feb. 1, 2007.
Hiro Akinaga et al: "Semiconductor Spintronics"; IEEE Transactions on Nantechnology, IEEE, New York, NY, US; vol. 1, No. 1, Mar. 2002; XP011077057.
Yoshiro Miura et al.; "First-Principles Design of Ferromagnetic Nanostructures Based on Group-IV Semiconductors"; Journal of Physics: Condensed Matter, Institute of Physics Publishing, Bristol, GB; vol. 16, No. 48; Dec. 8, 2004; pp. S5735-S5738; XP020060478.

* cited by examiner

FERROMAGNETIC SEMICONDUCTOR, METHOD FOR THE PRODUCTION THEREOF, COMPONENTS INCORPORATING THE SAME, AND CORRESPONDING USES OF SAID SEMICONDUCTOR

CROSS REFERENCE TO RELATED APPLICATIONS

This application is a national stage application filed under 35 U.S.C. 371 of International Application No. PCT/FR2007/000186, filed Feb. 1, 2007, which claims priority from French patent application 06 01149, filed Feb. 9, 2006.

FIELD AND BACKGROUND OF THE INVENTION

The present invention relates to a ferromagnetic semiconductor of group IV, to its fabrication process, to an electronic component of the diode type for injecting spins into or collecting spins from another semiconductor respectively, or else of the type comprising an element sensitive to a magnetic field, and to uses of this semiconductor relating to this component. The invention applies in particular to the injection of a current of spin-polarized carriers into a semiconductor or to the collection of said current therefrom and to the measurement of magnetic fields via such a ferromagnetic semiconductor.

The injection of a current of spin-polarized carriers into a semiconductor, said current being characterized by an excess of one of the two populations of carriers present (for example the parallel-spin or spin-up population), has been the subject of several recent publications. For example, mention may be made, by way of explanation, of the electronic components described in the article by Datta and Das, Applied Physics Letters, 56, 665, 1990.

The application of this injection of a spin-polarized current is of great interest in microelectronics, but its development is thwarted through lack of suitable materials for forming the current injection electrode.

The reason for this is that although the usual ferromagnetic metals, such as iron and many of its alloys, do have some of the required qualities, such as a high spin polarization and ferromagnetic behavior at room temperature, their electrical resistance is several orders of magnitude different from that of semiconductors, thereby causing great difficulties of implementation and requiring the current to be injected by a tunnel effect. This has the drawback of requiring the growth of a hybrid heterostructure of the semiconductor/tunnel barrier/ferromagnetic metal type, such a heterostructure being difficult to produce.

In contrast, there are semiconductors referred to as diluted magnetic semiconductors (DMSs) which do not have this drawback of having a very different resistivity from that of ordinary semiconductors. These DMSs typically consist of a semiconductor matrix of groups III-V, IV or II-VI in which magnetic impurities such as manganese, iron, chromium, cobalt or nickel are diluted.

In the case of a manganese dilution, manganese being an acceptor in III-V or IV semiconductors, the charge carriers consist of holes. When the manganese concentration and the density of holes (created naturally by the presence of manganese or intentionally introduced by co-doping) are sufficiently high in the DMSs, the latter may become ferromagnetic and the exchange coupling between manganese ions is induced by the holes.

A major drawback of these DMSs is that they all have at the present time a Curie temperature $T_C$ (the temperature up to which the semiconductor exhibits ferromagnetic properties) at or below room temperature (typically $\leq 300$ K approximately). For example, the reader may refer to the article by K. W. Edmonds et al., Phys. Rev. Lett. 92, 037201, 2004, which describes a semiconductor of formula GaMnAs having a Curie temperature of about only 159 K, and to the article by H. Saito et al., Phys. Rev. Lett. 90, 207202, 2003, which describes DMSs satisfying the formula $Zn_{1-x}Cr_xTe$ and having a Curie temperature approximately equal to 300 K ($\pm 10$ K), when x=0.20.

Another drawback of these DMSs lies in the undesirable but frequent formation of small ferromagnetic metallic precipitates within the semiconductor matrix, this being inconducive to genuinely ferromagnetic properties in the case of these DMSs and making the step of growing the crystals very difficult to carry out.

It should also be noted that the use of these gallium-based or tellurium-based materials is very difficult to envisage on silicon substrates, silicon being the base material of the microelectronics industry.

U.S. Pat. No. 6,946,301 discloses a thermal evaporation process for fabricating a ferromagnetic semiconductor of the GeMn type that has a Curie temperature possibly up to 250 K, for a manganese content of about 35%.

U.S. Pat. No. 6,307,241 teaches, in its single exemplary embodiment, how to fabricate a ferromagnetic semiconductor of the III-V (GaAs) type with a Curie temperature $T_C$ above 400 K using the ion implantation technique, with the implantation of manganese ions ($Mn^+$), followed by an annealing operation. As known to those skilled in the art (see in particular the article "Magnetooptical Study of Mn ions Implanted in Ge" by Franco D'Orazio et al, IEEE Transactions on Magnetics, Vol. 38, No. 5, September 2002), it should be noted that this implantation technique is not suitable for fabricating ferromagnetic semiconductors of group IV (typically based on germanium) with $T_C \geq 350$ K, it being specified that the phase thus obtained, of the $Ge_3Mn_5$ type, has a $T_C$ never exceeding 300 K.

A major drawback of these known magnetic semiconductors, of the diluted or even ferromagnetic type, lies in their relatively low Curie temperature, which is generally limited to about 300 K. In addition, when the measured Curie temperature is close to 300 K, it is difficult to exclude the presence of the $Ge_3Mn_5$ metallic phase, the Curie temperature of which is specifically close to 300 K.

SUMMARY OF THE INVENTION

One object of the present invention is to provide a ferromagnetic semiconductor that remedies the aforementioned drawbacks, and this objective is achieved in that the Applicant has discovered, unexpectedly, that if there is formed, in a thin film formed from a semiconductor of group IV comprising at least one magnetic element chosen from the group consisting of manganese, iron, cobalt, nickel and chromium, a matrix depleted in this magnetic element or these magnetic elements, within which matrix a discontinuous phase rich in this magnetic element or these magnetic elements is formed so as to generate a lateral modulation of the composition of the semiconductor in the plane of the thin film, then a ferromagnetic semiconductor having a Curie temperature of 350 K or higher, and advantageously 400K or higher, is obtained.

It should be noted that this ferromagnetic phase with a high Curie temperature stems from the zones enriched with said magnetic element or elements introduced.

To the knowledge of the Applicant, these very high Curie temperature values, measured using a magnetometer of the SQUID (Superconducting Quantum Interference Device) type, have hitherto never been achieved in ferromagnetic semiconductors of group IV.

According to another feature of the invention, said ferromagnetic semiconductor also has an extraordinary Hall effect (EHE) at a temperature above 300 K and possibly reaching at least 400 K.

Again, to the knowledge of the Applicant, these very high temperature values at which this EHE effect is manifested, these temperatures being measured using a magneto-transport system provided with a cryostat and a superconducting coil, have never hitherto been achieved in the case of ferromagnetic semiconductors of group IV.

Preferably, manganese is used as said magnetic element or as at least one of said magnetic elements so as to obtain maximum Curie temperatures and maximum temperatures at which said EHE effect occurs.

Also preferably, said ferromagnetic semiconductor according to the invention is based on at least one other element chosen from the group formed by germanium, silicon and alloys thereof.

Even more preferably, said ferromagnetic semiconductor according to the invention is based on germanium and manganese, thus advantageously corresponding to the formula GeMn, or, as a variant, a formula of the GeMnX type, in which X is a metal or an alloy of a metal which may for example be iron, cobalt, nickel or chromium.

In the preferred case of a GeMn semiconductor, it should be noted that said manganese-rich discontinuous phase does not have a composition similar to that of the compounds known from the phase diagram for the GeMn binary alloy, i.e. $Ge_3Mn_5$ or $Ge_8Mn_{11}$. Thus, said ferromagnetic semiconductor according to the invention is completely free of the metallic phase of formula $Ge_3Mn_5$, this being known not to provide semiconducting properties.

Advantageously, the atomic fraction of this magnetic element or these magnetic elements in said discontinuous phase is between 5 and 50%.

Even more advantageously, the atomic fraction of this magnetic element, such as manganese, or these magnetic elements, in said discontinuous phase and in said matrix is between 20% and 40% and between 1% and 10% respectively.

According to another feature of the invention, said discontinuous phase comprises an irregular distribution of volume zones rich in this magnetic element or these magnetic elements, which zones are separated from one another by said matrix. Said irregular distribution does not exclude, under certain growth conditions presented in the invention, the appearance of a characteristic distance and/or a characteristic organization between the volume zones rich in this magnetic element or these magnetic elements.

Advantageously, said volume zones are formed respectively by columns approximately perpendicular to the surface of said thin film, these preferably having an average diameter of between 1 nm and 10 nm for a thickness of said thin film of for example between 60 nm and 100 nm.

Even more advantageously, said columns, which are formed by being approximately parallel to one another in the thickness of said semiconductor, are separated from one another by an average distance of between 5 nm and 15 nm.

A process for fabricating said ferromagnetic semiconductor according to the invention consists of a molecular beam epitaxy comprising the simultaneous deposition of at least one magnetic element chosen from the group formed by manganese, iron, cobalt, nickel and chromium and of at least one other element chosen from group IVA of the Periodic Table, on a substrate whose temperature during the growth of the crystals is between 80° C. and 200° C. (preferably between 100° C. and 150° C.), in order to obtain a thin film of said semiconductor of group IV.

It should be noted that this growth temperature is very much below the growth temperatures of between 550° C. and 600° C. that are commonly used in the epitaxy of semiconductor materials of group IV and that this low growth temperature according to the invention enables the metastable semiconductor phases obtained, which are rich in one or more magnetic elements and are ferromagnetic, to be stabilized.

Advantageously, said deposition of said elements is carried out using an average [deposition rate for the magnetic element or elements/total deposition rates for said elements] ratio which is between 5% and 10%.

It should be noted that the essential parameters in this process according to the invention are in particular the temperature of the substrate during the deposition, the flux of said magnetic element, the flux of said element of group IVA during the deposition and the thickness of the thin film of the semiconductor obtained. It will be understood that these parameters may be modified to a certain extent, while still resulting in a ferromagnetic semiconductor according to the invention having a Curie temperature of at least 350 K and advantageously at least 400 K, thanks to a column structure, as mentioned above, but one in which the size of the columns, the concentration of the magnetic element or elements in them and their density in the thin film (i.e. the inter-column spacing) may be different from those indicated above.

Preferably, said magnetic element or at least one of said magnetic elements is manganese.

Also preferably, said other element or other elements deposited simultaneously are germanium, silicon or one of their alloys.

Even more preferably, said magnetic element and said other element deposited simultaneously are manganese and germanium, respectively, in order to obtain a GeMn or SiMn or even SiGeMn semiconductor, or else, as a variant, a semiconductor of the GeMnX, SiMnX or even SiGeMnX type in which X is a metal or an alloy of a metal which may for example be iron, cobalt, nickel or chromium.

Advantageously, said process according to the invention further includes the deposition of a germanium "buffer" layer on said substrate, prior to said simultaneous deposition of germanium and manganese for obtaining said thin film, so as to obtain a surface as smooth as possible on the atomic scale for two-dimensional growth of the germanium-manganese film.

Preferably, said substrate used for implementing this process is based on a material chosen from the group formed by germanium, silicon and alloys of these.

Advantageously, an electronic component according to the invention may be of the diode type for injecting spins into or collecting spins from another semiconductor respectively, or else of the type comprising an element sensitive to a magnetic field, this component advantageously comprising a ferromagnetic semiconductor according to the invention as defined above.

According to a first embodiment of the invention, this is a component of the diode type for injecting spins into or for collecting spins from another semiconductor, for example of group IV, comprising:

a first thin film formed from a first ferromagnetic semiconductor according to the invention as defined above;

a second thin film formed from a second semiconductor based on silicon, germanium or one of their alloys, in contact with which said first thin film is applied; and a carrier current source coupled to said first film for, in a first case, selectively extracting therefrom a spin-polarized current and for injecting it into said second film, or else, in a second case, for selectively extracting a spin-polarized carrier current from said second film and injecting it into said first film, in order for said discontinuous ferromagnetic phase rich in the magnetic element(s) of said first semiconductor to send this spin-polarized current to said second semiconductor or to receive said current therefrom, depending on said first or second case respectively.

More precisely according to this first embodiment of the invention:

said semiconductor has said matrix within which said discontinuous ferromagnetic phase is formed, so as to generate the aforementioned lateral modulation;

the atomic fraction of this magnetic element or these magnetic elements in said phase is advantageously between 5% and 50% and preferably between 20% and 40%, the atomic fraction of this magnetic element or these magnetic elements in said matrix then advantageously being in the latter case between 1 and 10%; and said phase comprises an irregular distribution of volume zones rich in this magnetic element or these magnetic elements which are separated from one another by said matrix and are respectively formed by columns approximately perpendicular to the surface of the thin film and are as defined above.

According to another feature of this first embodiment of the invention, said first ferromagnetic semiconductor is as defined above in relation to said columns, in order for said first and second thin films applied one to the other to form an Esaki tunnel diode in which said columns and said matrix of said first film form, with said second film, conducting junctions and blocking junctions respectively, owing to the difference in manganese concentrations and therefore difference in p-doping between the two zones.

According to a second embodiment of the invention, said component is sensitive to a magnetic field and may be a magnetic field sensor, which comprises a thin film formed from a ferromagnetic semiconductor according to the invention as defined above for the detection or measurement of said field by measuring a magnetoresistance effect with respect to a magnetic field applied perpendicular to the thin film or in the plane of the latter.

It should be noted that this component makes it possible to get round the phenomenon of "super-paramagnetism" that characterizes diluted systems based on nanoparticles and that the measured magnetoresistance according to the invention remains high, even at room temperature, unlike these diluted systems, thereby giving this component according to the invention excellent capability for measuring magnetic fields.

A first use according to the invention of a ferromagnetic semiconductor as defined above consists in the injection or collection by contact of a current of spin-polarized carriers, respectively into or from another semiconductor based on silicon and germanium or on an alloy of these, at a temperature equal to or greater than 350 K and possibly equal to or greater than 400 K.

A second use according to the invention of a ferromagnetic semiconductor as defined above consists of the measurement of a magnetic field by measuring a magnetoresistance effect in said semiconductor, at a temperature equal to or greater than 350 K and possibly equal to or greater than 400 K.

It should be noted that said ferromagnetic semiconductor according to the invention can also be used as a magnetic element in devices of the spin valve type, or else as a magnetized magnetic-field source region for applications in high-density magnetic recording.

BRIEF DESCRIPTION OF THE DRAWINGS

The aforementioned features of the present invention, together with others, will be better understood on reading the following description of several exemplary embodiments of the invention, given by way of illustration but implying no limitation, said description being given in conjunction with the appended drawings in which.

An example of the fabrication of ferromagnetic semiconductors according to the invention of the GeMn type will be described below, in each of which the discontinuous ferromagnetic phase was obtained by low-temperature MBE (molecular beam epitaxy). In this embodiment, the process was carried out under "ultravacuum" and the germanium and manganese were evaporated onto a single-crystal silicon or germanium substrate using solid sources corresponding to these two metallic elements respectively.

DETAILED DESCRIPTION

The following growth procedure was followed:

a) deoxidation of the substrate by using a standard procedure well known to those skilled in the art;

b) deposition on this deoxidized substrate of a germanium "buffer" layer with a thickness between 20 nm and 50 nm at a substrate temperature of 180° C., so as to obtain a surface as smooth as possible on the atomic scale for the two-dimensional growth of the germanium-manganese; and c) deposition of a GeMn layer with a thickness of 80 nm at a temperature of 100° C. in the case of the substrate thus treated.

This GeMn deposition was carried out with germanium and manganese partial pressures in the stream at the substrate of $1.8 \times 10^{-8}$ torr (i.e. 2.4 µPa) and at $2.5 \times 10^{-9}$ torr (i.e. 0.3 µPa) respectively. A deposition rate of around 0.02 nm/s was thus obtained.

Under these growth conditions, GeMn semiconductors were repeatedly obtained, each incorporating said discontinuous phase, which were in the form of a thin film in which a lateral modulation of the manganese composition was observed.

Figure 1:
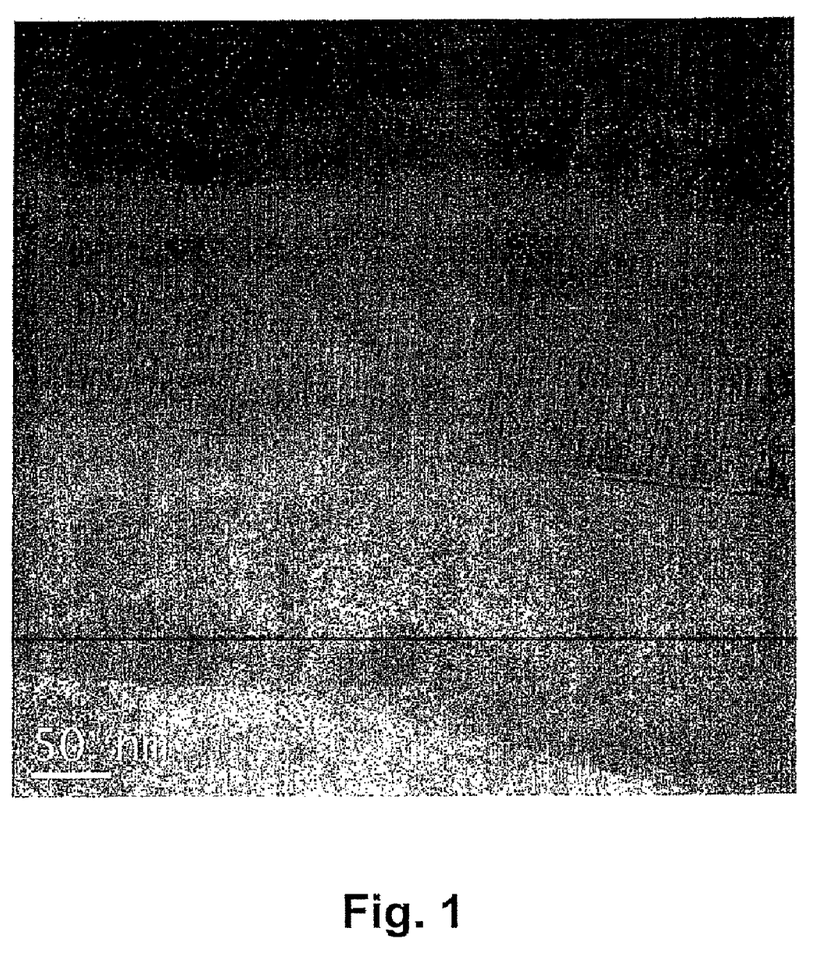
FIG. 1 is a micrograph of a ferromagnetic semiconductor according to the invention observed in lateral cross section.

As illustrated in the sectional view shown in FIG. 1, this lateral modulation takes the form of columns that are approximately perpendicular to the plane of the thin film, each consisting of an alloy richer in manganese than the matrix that surrounds them.

Measurements have established that each thin film according to the invention thus obtained, having a thickness of 80 nm, comprises on average 6 at % manganese. As regards the manganese-rich columns, these have an atomic fraction of about 34% manganese for an average column diameter of approximately 3 nm.

Figure 2:
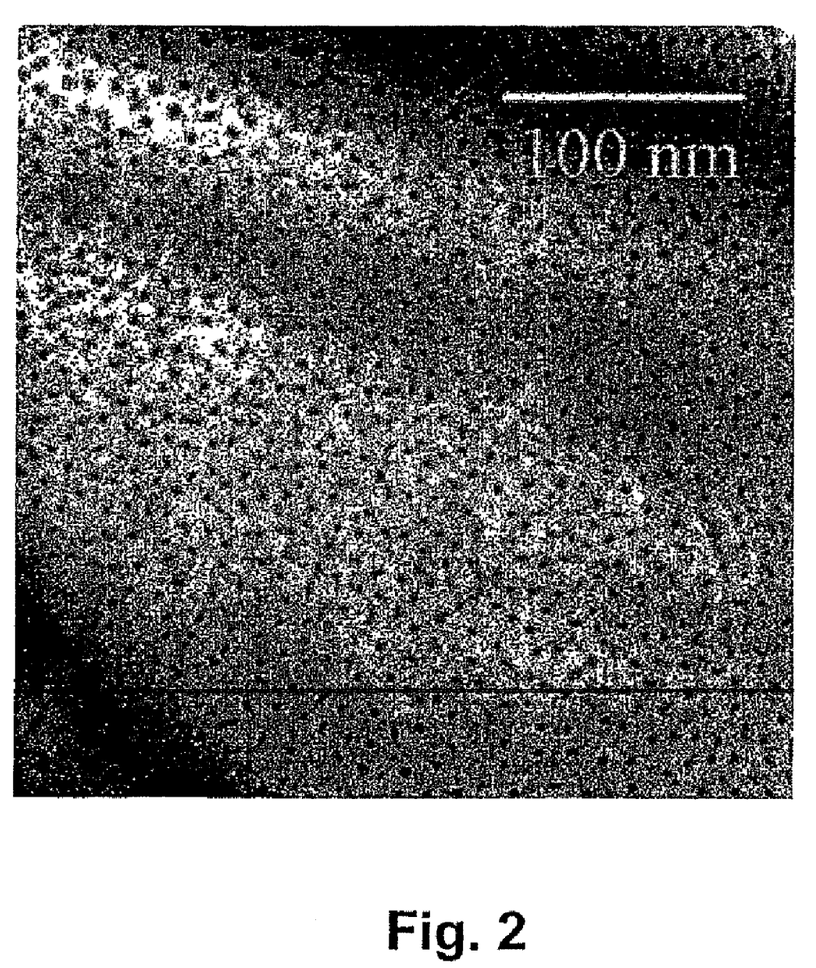
FIG. 2 is a micrograph of the ferromagnetic semiconductor of FIG. 1 observed from above.

As illustrated in the plan view shown in FIG. 2, it may be seen that these columns are distributed irregularly within the thin film of each GeMn semiconductor obtained and that they are spaced apart by an average distance of around 10 nm.

The ferromagnetism of each thin film thus obtained and its assignment to a discontinuous ferromagnetic semiconductor phase, and not to ferromagnetic inclusions in the form of precipitates as in the case of diluted magnetic semiconductors, was established using methods well known to those skilled in the art.

For this purpose, in the case of the GeMn semiconductors in film form thus obtained, the following were used in combination:

measurements of the magnetization as a function of temperature, using a SQUID magnetometer for measuring the Curie temperature of these GeMn semiconductors; and electrical transport measurements by means of a magneto-transport system equipped with a cryostat and a superconducting coil with magnetic field intensities ranging from 0 to 9 tesla, in order to demonstrate an EHE (extraordinary Hall effect) in these GeMn semiconductor films.

The following results were obtained for these GeMn films.

Each GeMn film obtained had a finite magnetization of 90 kA/m at 400 K, measured by said SQUID technique. The Curie temperature of each film was therefore clearly above 400 K.

In addition, it was verified that each GeMn film had a marked EHE (Hall angle at saturation reached 37°) up to a temperature of 300 K. This EHE is manifested, in a known manner, by a nonlinearity in the Hall resistivity measured at a low magnetic field intensity (<2 tesla). The observation of such an extraordinary Hall effect constitutes a proof of the spin polarization of the carriers involved in the electrical transport within each GeMn semiconductor film.

Figure 3:
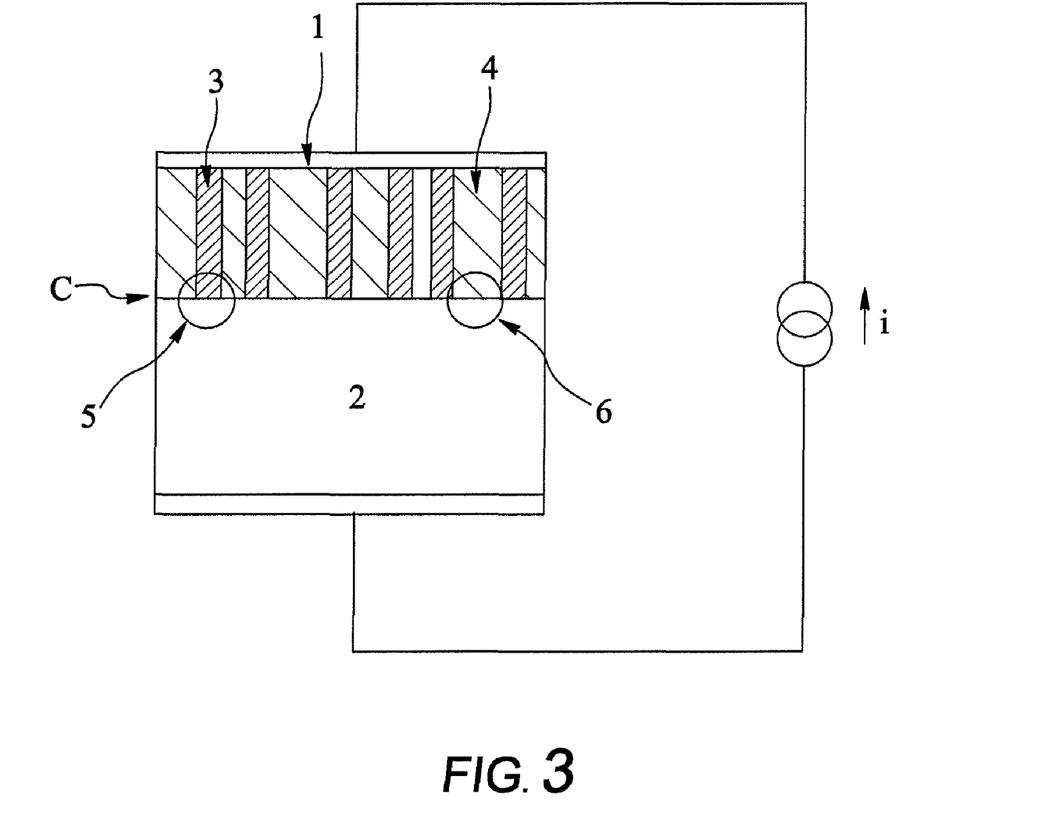
FIG. 3 is a schematic lateral cross-sectional view of an electronic component of diode type for the injection of spins into or the collection of spins from another semiconductor, for example of group IV, according to a first embodiment of a ferromagnetic semiconductor according to the invention.

One particularly advantageous use of these GeMn semiconductor films with a very high Curie temperature, having a lateral modulation of the Mn composition, as a device for injecting spin-polarized carriers into another semiconductor or a device for collecting said carriers from another semiconductor, for example made of germanium or silicon, in order to form a diode-type electronic component C is illustrated in FIG. 3.

The component C comprises a first thin film 1 formed from the GeMn semiconductor obtained using the aforementioned process, a second thin film 2 formed by said other semiconductor, and in contact with which the first layer 1 is applied, and the carrier current source (not illustrated) in order for the Mn-rich ferromagnetic phase of the first thin film 1 to send this spin-polarized current to the second thin film 2 or to receive said current therefrom, respectively.

In the absence of doping complementary to that introduced by the manganese, manganese constituting a double acceptor in germanium, the carriers are necessarily holes. To carry out the selective injection of spin-polarized holes into, or the selective collection thereof in, the second (highly n-doped) thin film 2 from the ferromagnetic columns 3 forming said phase, the principle of an Esaki tunnel diode is used, based on the fact that the transparency of a p-n tunnel diode increases with the doping of the films.

Consequently, the tunnel diode obtained is transparent at each manganese-enriched column 3 forming a conducting junction 5 (since each column 3 is highly p-doped) and will be insulating in the manganese-depleted matrix 4 forming a blocking junction 6 (since the matrix 4 is lightly p-doped).

In this way, the carrier current derives very predominantly from the columns 3, which is desired for obtaining the injection of a current of spin-polarized carriers into the lower electrode 2 of the component C, advantageously chosen to be based on germanium, silicon or one of their alloys, up to a temperature of 400 K. The same applies in the case in which the current derives from the lower electrode 2—the collection of spin-polarized carriers takes place very predominantly in the columns 3.

It has also been sought to use the GeMn semiconductor films obtained by the process described above as magnetoresistive field sensors.

In each 80 nm-thick GeMn film thus obtained, large magnetoresistance effects were measured for a field applied perpendicular to the thin film and for planar transport, this thin film having been placed in contact with gold electrodes.

A positive magnetoresistance of +50% has in fact been measured at room temperature for a magnetic field intensity varying from 0 to 3 tesla (this magnetoresistance becomes linear in the magnetic field and increases strongly up to a few thousand percent when the temperature is reduced).

The invention claimed is:

1. A ferromagnetic semiconductor of group IV, comprising at least one magnetic element chosen from the group formed by manganese, iron, cobalt, nickel and chromium, characterized in that the ferromagnetic semiconductor has a Curie temperature of 350 K or higher and an extraordinary Hall effect (EHE) at a temperature above 300 K.

2. The ferromagnetic semiconductor as claimed in claim 1, characterized in that the ferromagnetic semiconductor has the Curie temperature of 400 K or higher.

3. The ferromagnetic semiconductor as claimed in claim 1, characterized in that said magnetic element or at least one of said magnetic elements is manganese.

4. The ferromagnetic semiconductor as claimed in claim 3, characterized in that the ferromagnetic semiconductor is based on germanium and manganese.

5. The ferromagnetic semiconductor as claimed in claim 4, characterized in that the ferromagnetic semiconductor is completely free of the metallic phase of formula $Ge_3Mn_5$.

6. The ferromagnetic semiconductor as claimed in claim 1, characterized in that the ferromagnetic semiconductor is based on at least one other element chosen from the group formed by germanium, silicon and alloys thereof.

7. The ferromagnetic semiconductor as claimed in claim 1, said ferromagnetic semiconductor forming a thin film, wherein the ferromagnetic semiconductor has a matrix depleted in said magnetic element or said magnetic elements, within which matrix a discontinuous phase, which is rich in said magnetic element or said magnetic elements and is ferromagnetic up to said Curie temperature, is formed so as to generate a lateral modulation of the composition of said ferromagnetic semiconductor in the plane of said thin film.

8. The ferromagnetic semiconductor as claimed in claim 7, characterized in that the atomic fraction of said magnetic element or said magnetic elements in said discontinuous phase is between 5% and 50%.

9. The ferromagnetic semiconductor as claimed in claim 7, characterized in that the atomic fraction of said magnetic element or said magnetic elements in said discontinuous phase and in said matrix is between 20% and 40% and between 1% and 10%, respectively.

10. The ferromagnetic semiconductor as claimed in claim 7, characterized in that said phase has an irregular distribution of volume zones rich in this magnetic element or these magnetic elements, said zones being separated from one another by said matrix.

11. The ferromagnetic semiconductor as claimed in claim 10, characterized in that said volume zones are formed respectively by columns approximately perpendicular to the surface of said thin film.

12. The ferromagnetic semiconductor as claimed in claim 11, characterized in that said columns have an average diameter of between 1 nm and 10 nm for a thickness of said thin film of between 60 nm and 100 nm.

13. The ferromagnetic semiconductor as claimed in claim 12, characterized in that said columns are separated from one another by an average distance of between 5 nm and 15 nm.

14. An electronic component of the diode type for injecting spins into or collecting spins from another semiconductor respectively, or else of the type comprising an element sensitive to a magnetic field, characterized in that the electronic component comprises a ferromagnetic semiconductor as claimed in claim 1.

15. The electronic component as claimed in claim 14, said component being of the diode type for injecting spins into or for collecting spins from another semiconductor, characterized in that the electronic component comprises:
  a first thin film formed from said ferromagnetic semiconductor;
  a second thin film formed from a second semiconductor based on silicon, germanium or one of their alloys, in contact with which said first thin film is applied; and
  a carrier current source coupled to said first film for, in a first case, selectively extracting therefrom a spin-polarized current and for injecting it into said second film, or else, in a second case, for selectively extracting a spin-polarized current from said second film and injecting it into said first film,
  characterized in that said ferromagnetic semiconductor is based on germanium and manganese and is completely free of the metallic phase of formula Ge3Mn5, in order for said ferromagnetic phase rich in the magnetic element(s) of said first semiconductor to send this spin-polarized current to said second semiconductor or to receive said current from the latter, depending on said first case or said second case respectively.

16. The electronic component as claimed in claim 15, characterized in that said first ferromagnetic semiconductor has a matrix depleted in said magnetic elements(s) within which matrix a discontinuous phase which is rich in said magnetic element(s) and is ferromagnetic up to said Curie temperature, is formed so as to generate a lateral modulation of the composition of said semiconductor in the plane of said film, and wherein said discontinuous phase has an irregular distribution of volume zones rich in said magnetic element(s), said zones being separated from one another by said matrix, in order for said first and second thin films applied one to the other to form an Esaki tunnel diode in which said columns and said matrix of said first film form, with said second film, conducting junctions and blocking junctions respectively.

17. The electronic component as claimed in claim 2, characterized in that the electronic component includes a thin film formed from a said ferromagnetic semiconductor, for the detection or measurement of said field by measuring a magnetoresistance effect with respect to a magnetic field applied perpendicular to said thin film or in the plane of the latter.

18. A method for the injection or collection by contact of a current of spin-polarized carriers, respectively into or from another semiconductor based on silicon and germanium or on an alloy of these, at the Curie temperature equal to or greater than 350 K, said method comprising using the ferromagnetic semiconductor as claimed in claim 1 for said injection or collection.

19. A method for the measurement of a magnetic field comprising measuring a magnetoresistance effect in the ferromagnetic semiconductor as defined in claim 1, which has the desired magnetoresistance properties up to the Curie temperature equal to or greater than 350 K.

* * * * *

UNITED STATES PATENT AND TRADEMARK OFFICE
CERTIFICATE OF CORRECTION

| | |
|---|---|
| PATENT NO. | : 8,310,018 B2 |
| APPLICATION NO. | : 12/161995 |
| DATED | : November 13, 2012 |
| INVENTOR(S) | : Jamet et al. |

It is certified that error appears in the above-identified patent and that said Letters Patent is hereby corrected as shown below:

Column 6,
Lines 25 through 37, the heading "DETAILED DESCRIPTION" should appear before the paragraph starting with line 25, "An example of the fabrication of ferromagnetic".

Column 10,
Line 20, "claim 2" should read --claim 14--.

Signed and Sealed this
Twenty-sixth Day of February, 2013

Teresa Stanek Rea
*Acting Director of the United States Patent and Trademark Office*